United States Patent [19]
Banerjee et al.

[11] Patent Number: 5,436,474
[45] Date of Patent: Jul. 25, 1995

[54] MODULATION DOPED FIELD EFFECT TRANSISTOR HAVING BUILT-IN DRIFT FIELD

[75] Inventors: Sanjay K. Banerjee; Aloysious F. Tasch, Jr.; Ben G. Streetman, all of Austin, Tex.

[73] Assignee: Board of Regents of the University of Texas System, Austin, Tex.

[21] Appl. No.: 352,266

[22] Filed: Dec. 7, 1994

Related U.S. Application Data

[63] Continuation of Ser. No. 57,937, May 7, 1993, abandoned.

[51] Int. Cl.[6] .............................................. H01L 29/205
[52] U.S. Cl. .................................... 257/194; 257/191; 257/192; 257/212; 257/472
[58] Field of Search ............... 257/191, 192, 194, 195, 257/183, 212, 472

[56] References Cited

U.S. PATENT DOCUMENTS 5,155,571  10/1992  Wang et al. ............................ 257/19

FOREIGN PATENT DOCUMENTS 59-0969  1/1984  Japan .................................... 257/194
62-45183  2/1987  Japan .................................... 257/191

Primary Examiner—Jerome Jackson
Assistant Examiner—John Guay
Attorney, Agent, or Firm—Townsend and Townsend Khourie and Crew

[57] ABSTRACT

A MODFET device has highly doped source and drain regions separated by an undoped semiconductor alloy in which the mole fraction is graded between the source and the drain and with a conduction (and/or valence) band discontinuity at the heterojunction between the source and semiconductor alloy channel region of the device. Due to the graded mole fraction, the bandgap of the undoped semiconductor alloy decreases along the channel from the source to the drain and creates a built-in electric field. The higher bandgap in the source compared to that in the channel permits high energy carrier injection into the channel, with the built-in longitudinal electric field increasing carrier drift velocity and reducing transit time between the source and drain. In a preferred embodiment, the MODFET device has a vertical structure with the source and semiconductor alloy layers stacked on a drain substrate. The channel is defined by selectively etching the stacked structure with the exposed edge of the semiconductor alloy layer forming the channel. An undoped semiconductor layer and a modulation doped semiconductor layer are formed over the exposed edge with the undoped layer forming a spacer for the modulation doped layer. Carriers from the modulation doped layer spill over into the undoped channel and form a two-dimensional (or hole) electron gas. The devices can be implemented as p-channel and as n-channel devices fabricated in III–V compound and in Column IV-based semiconductor materials.

12 Claims, 2 Drawing Sheets

MODULATION DOPED FIELD EFFECT TRANSISTOR HAVING BUILT-IN DRIFT FIELD

The U.S. Government has rights in the claimed invention pursuant to National Science Foundation Contract No. CHE-8920120 with the University of Texas at Austin.

This invention was also made with Government support under contract No. N00014-87-K-0323 awared by the Department of the Navy, Office of Naval Research.

This is a continuation of application Ser. No. 08/057,937, filed May 7, 1993, now abandoned.

BACKGROUND OF THE INVENTION

This invention relates generally to semiconductor devices, and more particularly the invention relates to modulation-doped field effect transistors and fabrication processes.

In the continuing quest for higher speeds and transconductances in field effect transistors, bandgap engineering is being employed in device fabrication through use of heterojunctions in Column IV (e.g., SiGe) and III-V (e.g., AlGaAs) compound alloys. The Metal Oxide Semiconductor Field Effect Transistor (MOSFET) has evolved into the Modulation-Doped Field Effect Transistor (MODFET) by causing carriers to spill over from a high bandgap doped region into a low bandgap undoped region in a heterostructure. The carriers in the "modulation doped" channel have very high carrier mobilities because they do not suffer from the deleterious effects of ionized impurity scattering. This results in lower transit times, higher switching speeds, and increased drive currents and transconductances than in conventional MOSFETs.

The present invention is directed to an improved MODFET device which has hot carrier injection from a high bandgap source into a lower bandgap channel, with the carrier subjected to a built-in electric field along the channel region of the device.

SUMMARY OF THE INVENTION

In accordance with the invention, a MODFET device has highly doped source and drain regions separated by an undoped semiconductor alloy in which the mole fraction is graded between the source and the drain and with a conduction and/or valence band discontinuity at the heterojunction between the source and semiconductor alloy channel region of the device. Due to the graded mole fraction, the bandgap of the undoped semiconductor alloy decreases along the channel from the source to the drain and creates a built-in electric field. The higher bandgap in the source compared to that in the channel permits high energy carrier injection into the channel, with the built-in longitudinal electric field along the channel increasing carrier drift velocity and reducing transit time between the source and drain.

In a preferred embodiment, the MODFET device has a vertical structure with the source and semiconductor alloy layers stacked on a drain substrate. The channel is defined by selectively etching the stacked structure with the exposed edge of the semiconductor alloy layer forming the channel. An undoped semiconductor alloy layer and a modulation doped semiconductor layer are formed over the exposed edge with the undoped layer forming a spacer for the modulation doped layer. Carriers from the modulation doped layer spill over into the undoped channel and form a two-dimensional electron (or hole) gas.

The critical design parameter is to ensure that the bandgap of the modulation-doped layer and the spacer layer are higher than the highest bandgap in the channel to ensure carrier spill-over. For AlGaAs-based devices, it is necessary to use an alloy ($Al_yGa_{1-y}As$) rather than pure AlAs because pure AlAs oxidizes in contact with air. For SiGe-based devices, the modulation-doped layer and the spacer layer can be pure Si instead of a SiGe alloy because Si does not have the same oxidation problems as pure AlAs.

The invention can be implemented in p-channel and in n-channel devices fabricated in III-V compound (e.g., AlGaAs) and in Column IV-based (e.g., SiGe) semiconductor materials.

The invention and objects and features thereof will be more readily apparent from the following detailed description and appended claims when taken with the drawing.

DETAILED DESCRIPTION OF ILLUSTRATIVE EMBODIMENTS

Figure 1A:
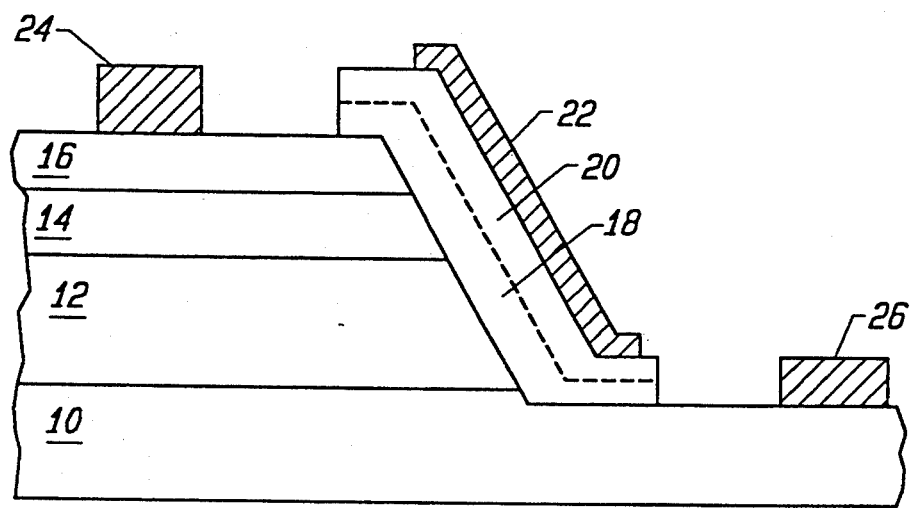
FIG. 1A is a side view in section illustrating a MODFET device in accordance with one embodiment of the invention.

FIG. 1A is a side view in section of an n-channel MODFET device formed in compound semiconductor material in accordance with one embodiment of the invention. The device comprises an N+GaAs substrate 10 which forms the drain of the device, an undoped $Al_xGA_{1-x}As$ alloy layer 12 formed on the substrate 10, an N+AlAs layer 14 formed on layer 12, and an N+GaAs layer 16 formed on layer 14. The substrate 10 forms the drain of the device, the undoped $Al_xGA_{1-x}As$ layer 12 forms the channel region, and the N+AlAs layer 14 forms the source region. The N+GaAs layer 16 protects the AlAs layer from oxidizing in contact with air.

The drain 10 has a dopant concentration on the order of $10^{17}$–$10^{18}$ atoms per cubic centimeter, and the undoped $Al_xGA_{1-x}As$ alloy is formed by molecular beam epitaxy (MBE) or organometallic chemical vapor deposition (OMCVD), for example, with the mole fraction "x" graded to increase towards the source. The N+AlAs source 14 and N+GaAs layer 16 are formed by molecular beam epitaxy (MBE) or organometallic chemical vapor deposition (OMCVD) with each layer having a dopant concentration on the order of $10^{17}$–$10^{18}$ atoms per cubic centimeter.

The mole fraction "x" is graded so that there is an appropriate conduction band discontinuity between the AlAs and the $Al_xGa_{1-x}As$ alloy at the source/channel heterojunction for high energy injection of carriers into the channel. Further, the bandgap of the $Al_xGa_{1-x}As$ alloy decreases along the channel from the source to the drain to create a built-in drift electric field to aid the "drift" of carriers along the channel.

After the layers 10, 12, 14, 16 are grown, a crystallographically dependent V-groove wet chemical etch is performed to expose the channel in the edge of the undoped $Al_xGa_{1-x}As$. This is followed by growth of an undoped spacer $Al_yGa_{1-y}As$ layer 18 and a "modulation doped" $N^+Al_yGa_{1-y}As$ layer 20 thereon having a dopant concentration on the order of $10^{15}$ atoms per cubic centimeter. A Schottky gate contact 22 is then formed on the modulation doped layer by depositing a refractory metal such as tungsten thereon.

The carriers from the $N^+Al_yGa_{1-y}As$ layer 20 spill over into the undoped channel and form a two-dimensional electron gas as in a conventional MODFET. In order to achieve this, the mole fraction "y" of the undoped spacer layer and the modulation doped layer is chosen such that it is higher than the highest "x" in the channel layer 12. This ensures that the bandgap of the doped $N^+Al_yGa_{1-y}As$ layer is higher than the highest $Al_xGa_{1-x}As$ bandgap in the channel. The regrown layers are photolithographically patterned and etched to complete the device. Source and drain ohmic contacts 24, 26 are formed. Device isolation is achieved by mesa etching or by proton bombardment.

Figure 1B:
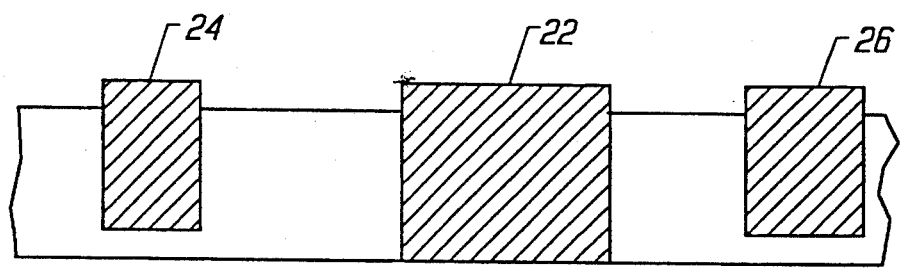
FIG. 1B is a plan view of the device of FIG. 1A.
Figure 1C:
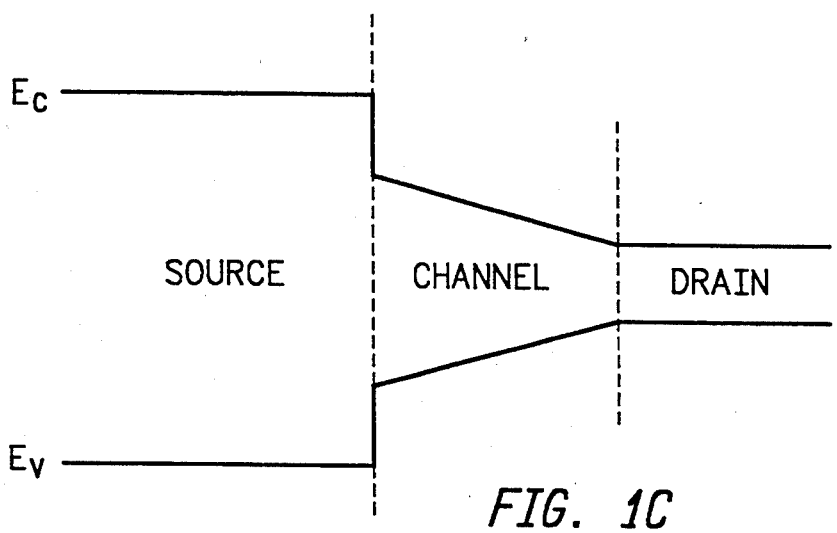
FIG. 1C is bandgap diagram for the device of FIG. 1.

FIG. 1B is a plan view of the device of FIG. 1A, and FIG. 1C is a bandgap diagram along the channel from source to drain illustrating the conduction band discontinuity at the source/channel heterojunction for high energy injection of carriers into the channel and with the bandgap of the undoped $Al_xGa_{1-x}As$ alloy decreasing along the channel from the source to the drain to create a built-in electric field. It is especially important to create a longitudinal electric field near the source because under normal operating conditions a high voltage is applied to the drain so that there is a high electric field and hence high carrier drift velocity along the channel near the drain. The channel near the source is generally not pinched off and has a lower longitudinal electric field and hence lower carrier drift velocity along the channel. In this part of the channel high energy carrier injection and the built-in electric field significantly increase the carrier drift velocity and reduce transit time.

Figure 2A:
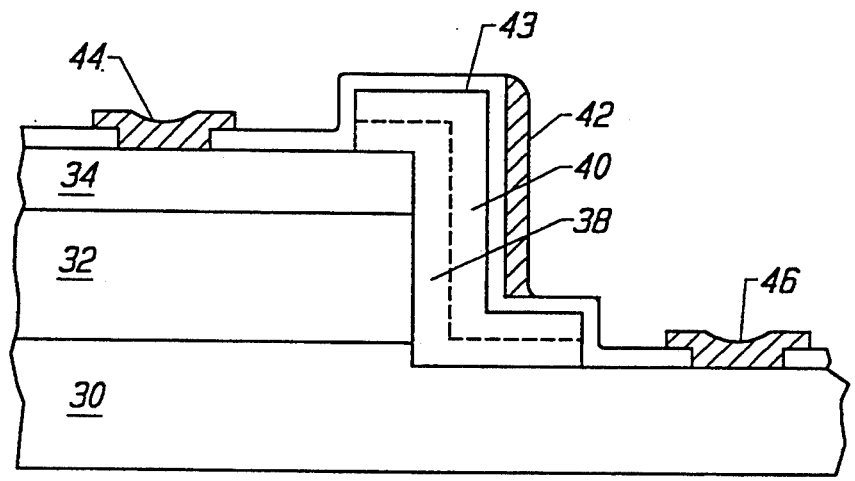
FIG. 2A is a side view in section of a MODFET device in accordance with another embodiment of the invention.
Figure 2B:
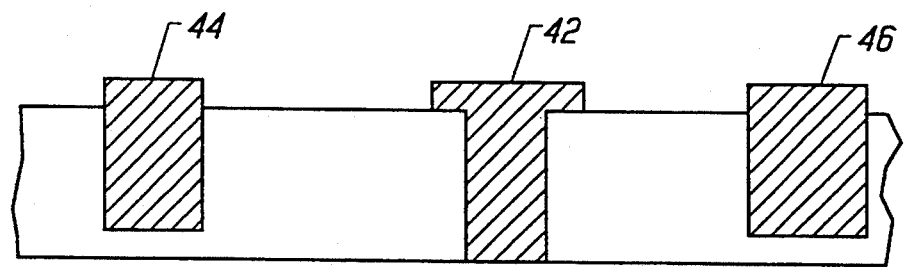
FIG. 2B is a plan view of the device of FIG. 2A.

FIG. 2A and 2B are a side view in section and plan view, respectively, of a MODFET device in accordance with another embodiment of the invention. In this embodiment, a p-channel device is formed using Column IV-based materials. Again, the drain of the device is formed in a supporting substrate 30 of P+ silicon having a dopant concentration on the order of $5 \times 10^{19}$ atoms per cubic centimeter. An undoped $Si_xGe_{1-x}$ alloy is then grown on substrate 30 with the mole fraction "x" again graded from the source to the drain. The source is formed by P+ silicon layer 34 having a dopant concentration on the order of $5 \times 10^{19}$ atoms per cubic centimeter.

After growth of the undoped $Si_xGe_{1-x}$ alloy 32 and the silicon source layer 34, reactive ion etching is used to form the side wall for the channel. An undoped silicon buffer layer 38 and a modulation doped silicon layer 40 are grown, patterned, and etched. A gate oxide 43 is then grown on the modulation doped layer 40 and a doped polysilicon or aluminum gate 42 is then deposited over the oxide and etched by reactive ion etching to leave a side wall filament as a self-aligned gate. Ohmic contacts 44, 46 are again formed on the source and drain regions. The device is then mesa etched for isolation or oxide isolated.

There have been described embodiments of a MODFET having increased speed and transconductance by injecting high energy carriers into the channel near the source across a semiconductor heterojunction and with the high kinetic energy carriers further speeded by creating a built-in electric field along the channel near the source by appropriately changing the mole fraction of the semiconductor alloy in the channel. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A modulation doped field effect (MODFET) transistor comprising:
   a first region of a doped semiconductor material of a first conductivity type which functions as a drain,
   a second region of an undoped semiconductor alloy with constituent parts having a varying mole fraction, x, and overlying said first region, said second region having an exposed edge which functions as a channel,
   a third region of a doped semiconductor material of said first conductivity type overlying the second region which functions as a source, said source and said channel being separated by a heterojunction with said source having a higher energy band gap than said channel at said heterojunction for high energy carrier injection from said source into said channel,
   an undoped layer of said semiconductor alloy with constituent parts having a mole fraction, y, overlying said exposed edge and extending from said source to said drain and which functions as a buffer layer,
   a doped layer of said semiconductor alloy of said first conductivity type overlying said undoped layer and functioning as a modulation doped layer,
   said mole fraction, x, being graded in said second region from said source to said drain to provide a conduction band discontinuity at said heterojunction between said source and said channel for high energy injection of carriers into said channel and provide an electric field between said source and said drain,
   said mole fraction, y, being higher than said mole fraction, x, whereby carriers from said doped layer spill over into said channel.

2. The transistor as defined by claim 1 wherein said semiconductor material is a compound semiconductor material.

3. The transistor as defined by claim 2 wherein said compound semiconductor material in said first region is GaAs, said semiconductor alloy is $Al_xGa_{1-x}As$, said third region includes a layer of AlAs and a layer of GaAs, and said undoped layer and said doped layer comprise $Al_yGa_{1-y}As$.

4. The transistor as defined by claim 3 wherein said one conductivity type is n-type.

5. The transistor as defined by claim 4 wherein said first region and said third region have a dopant concentration on the order of $10^{17}$–$10^{18}$ atoms per cubic centimeter.

6. The transistor as defined by claim 5 and further including ohmic contacts to said first region and to said third region and a Schottky contact to said doped layer.

7. A modulation doped field effect (MODFET) transistor comprising a first region of a doped semiconductor material of a first conductivity type which functions as a drain, a second region of an undoped semiconductor alloy with constituent parts having a mole fraction, x, and overlying said first region, said second region having an exposed edge which functions as a channel, a third region of a doped semiconductor material of said first conductivity type overlying the second region which functions as a source, said source and said channel being separated by a heterojunction with said source having a higher energy band gap than said channel at said heterojunction for high energy carrier injection from said source into said channel, an undoped layer of said semiconductor material overlying said exposed edge and extending from said source to said drain and which functions as a buffer layer, a doped layer of said semiconductor material of said first conductivity type overlying said undoped layer and functioning as a modulation doped layer, said mole fraction, x, being graded in said second region from said source to said drain to provide a conduction band discontinuity at said heterojunction between said source and said channel for high energy of carriers into said channel and provide an electric field between said source and said drain.

8. The transistor as defined by claim 7 wherein said semiconductor material includes a group IV material.

9. The transistor as defined by claim 8 wherein said first region and said third region comprise silicon, said second region comprises $Si_xGe_{1-x}$, and said undoped layer and said doped layer comprise Si.

10. The transistor as defined by claim 9 wherein said one conductivity type is p-type.

11. The transistor as defined by claim 10 wherein said first and third regions have a dopant concentration on the order of $5 \times 10^{19}$ atoms per cubic centimeter.

12. The transistor as defined by claim 1 wherein the thickness of said second region is approximately 0.5 μm.

* * * * *